United States Patent
Tanaka et al.

(10) Patent No.: US 7,622,860 B2
(45) Date of Patent: Nov. 24, 2009

(54) ORGANIC ELECTROLUMINESCENT DISPLAY DEVICE AND MANUFACTURING METHOD OF ORGANIC ELECTROLUMINESCENT DISPLAY DEVICE

(75) Inventors: Masahiro Tanaka, Chiba (JP); Takahiro Ochiai, Chiba (JP); Toshiyuki Matsuura, Mobara (JP); Hajime Murakami, Shinjuku (JP)

(73) Assignee: Hitachi Displays, Ltd., Chiba-ken (JP)

( * ) Notice: Subject to any disclaimer, the term of this patent is extended or adjusted under 35 U.S.C. 154(b) by 439 days.

(21) Appl. No.: 11/712,495

(22) Filed: Mar. 1, 2007

(65) Prior Publication Data

US 2007/0228934 A1 Oct. 4, 2007

(30) Foreign Application Priority Data

Mar. 31, 2006 (JP) ............................... 2006-097514

(51) Int. Cl.
*H01L 51/50* (2006.01)

(52) U.S. Cl. .................. 313/503; 313/500; 445/23
(58) Field of Classification Search ......... 313/500–512; 257/40, 79, 88, 89
See application file for complete search history.

(56) References Cited

FOREIGN PATENT DOCUMENTS

JP 2003-108068 9/2001

*Primary Examiner*—Joseph L Williams
(74) *Attorney, Agent, or Firm*—Stites & Harbison PLLC; Juan Carlos A. Marquez, Esq.

(57) ABSTRACT

The present invention provides a top-emission-type organic EL display device. In a top-emission-type organic EL display device which includes organic EL elements each of which is formed by stacking a reflective lower electrode, a function layer and a light-transmissive upper electrode in order, the upper electrode contains a plurality of fine particles which are made of a material different from a material of the upper electrode. The fine particles are preferably made of silica. A portion of the upper electrode may be provided below the fine particles and a portion of the upper electrode may be provided above the fine particles.

6 Claims, 6 Drawing Sheets

ORGANIC ELECTROLUMINESCENT DISPLAY DEVICE AND MANUFACTURING METHOD OF ORGANIC ELECTROLUMINESCENT DISPLAY DEVICE

CROSS-REFERENCE TO RELATED APPLICATIONS

The disclosure of Japanese Patent Application No. 2006-097514 filed on Mar. 31, 2006 including the claims, the specification, the drawings and the abstract is incorporated herein by reference in its entirety.

BACKGROUND

1. Field of the Invention

The present invention relates to a top emission type organic EL display device and the manufacturing method thereof and, more particularly to a technique which enhances a light acquisition efficiency of organic EL elements.

2. Description of the Related Art

Patent document 1 (JP-A-2004-349064) discloses an organic EL display device which is configured such that the organic EL display device takes out light through a glass substrate. In the organic EL display device, an unevenness which is constituted of a gel film generated from a sol solution of a metal alkoxide is provided between a transparent electrode and a glass thus scattering light.

SUMMARY

Conventionally, inventors of the present invention have formed unevenness on an electrode surface per se of an ITO which is formed as an upper electrode. As a forming method of such unevenness, although a surface of the ITO which constitutes the upper electrode is made coarse, such coarse surface forming processing also has to take a margin of the processing into consideration and hence, it is necessary to form the upper electrode with a film thickness which is obtained also by adding a thickness of the process margin to a film thickness which is obtained by combining a thickness of the unevenness per se and a thickness of a back ground below the unevenness whereby the optical transmissivity is lowered.

Then, the inventors of the present invention have arrived at a method in which unevenness per se is formed using member other than the ITO. Conventionally, such a technique is disclosed in patent document 1 described above. When the above-mentioned technique is applied to a top-emission-type organic EL display device, a function layer which includes an organic layer and a lower electrode are formed before a transparent conductive film of the upper electrode which is arranged on a light acquisition side is formed and hence, when a sol solution of metal alkoxide is applied to these films and layers, the lower electrode and the organic layer react with the sol solution.

That is, when the top emission type organic EL display device is formed by the above-mentioned technique, the organic layer and the lower electrode are destroyed and hence, the technique becomes no more applicable substantially.

It is an object of the present invention to provide a top emission type organic EL display device which can enhance a light acquisition efficiency thereof.

The manufacturing method of the top-emission-type organic EL display device which includes organic EL elements each of which is formed by stacking reflective lower electrodes, a function layer and light transmissive upper electrodes in order, wherein fine particles which are made of a material different from a material of the upper electrode are formed after forming a portion of the upper electrodes and, thereafter, remaining upper electrodes are formed.

According to the above-mentioned forming method, it is possible to realize a top-emission-type organic EL display device having high light acquisition efficiency without influencing the organic layer and the lower electrode which constitute the back ground. The enhancement of the light acquisition efficiency brings the lowering of the power consumption and hence, it is possible to provide an organic EL display device which exhibits the low power consumption.

Further, the top-emission-type organic EL display device which is manufactured by the manufacturing method adopts the structure in which each pixel includes a plurality of light transmissive fine particles in the upper electrodes. In this structure, the diffusion layer is closely arranged directly above the organic layer including the light emitting layer and hence, it is possible to obtain an advantageous effect that blurring of the light emission of the pixel per se is decreased. Further, it is preferable to realize the structure by dispersing silica beads as the fine particles.

Further, as the structure to enhance the light acquisition efficiency, in addition to the above-mentioned structure, it is preferable to provide the structure which seals the sealing substrate by fixing the sealing substrate by way of a space. In this manner, by forming unevenness to the upper electrode thus forming a gas layer (containing 99% of nitrogen and the like) which is held by the sealing substrate on the light acquisition side and exhibits refractive index of substantially 1, even with respect to the light which is diffused in front of the space, substantially most of the light can be acquired to the sealing substrate side and hence, such structure is preferable to enhance the light acquisition efficiency.

According to the present invention, it is possible to provide the top-emission-type organic EL display device which can enhance light acquisition efficiency.

DETAILED DESCRIPTION OF THE INVENTION

Hereinafter, the best mode for carrying out the present invention is explained in detail in conjunction with drawings showing embodiments.

Embodiment 1

Figure 1:
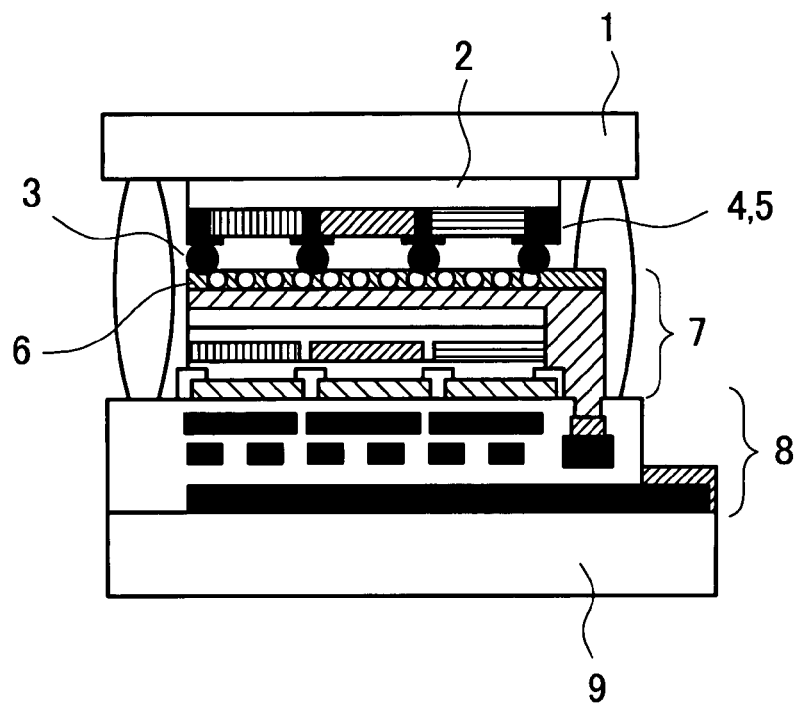
FIG. 1 is a conceptual cross-sectional view of an organic EL display device.

FIG. 1 is a conceptual cross-sectional view of the organic EL display device.

A TFT substrate 9 which includes organic EL elements 7 and TFT forming layers 8 which are formed under the organic EL elements 7 and drives the organic EL elements 7 and a sealing substrate 1 which includes color filters 4, black matrixes 5 and desiccant layers 2 are adhered to each other using a sealing material in the direction in which the components formed on the respective substrates face each other while maintaining a gas layer therebetween using conductive beads 3.

The organic EL element 7 is configured such that a lower electrode, a functional layer including a light-emitting layer and an upper electrode 6 are stacked in this order. Inside the upper electrode 6, a plurality of light-transmissive fine particles smaller than 10 µm is arranged in a scattered manner for each pixel. Further, a particle size of the fine particles is preferably 1 µm or smaller and 50 nm or larger.

Figure 2:
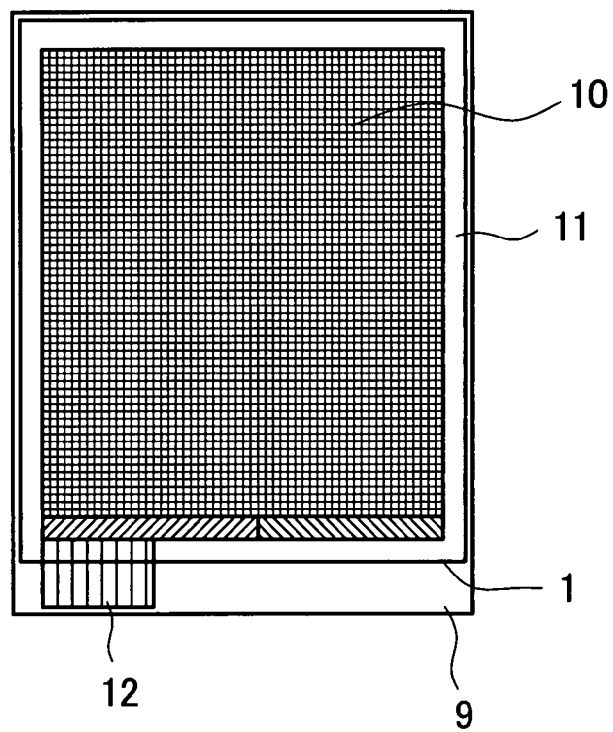
FIG. 2 is a plan view of the organic EL display device.

FIG. 2 is a plan view of the organic EL display device.

An ultra-violet-ray curing type sealing agent, especially an epoxy resin of a cation-curing-type is applied to a frame-like sealing seal region situated in the periphery of a pixel region 10 formed inside the TFT substrate 9. The pattern of the pixels and the pattern of the color filter 4 are aligned to be adhered to each other, and the sealing agent is cured by applying ultra violet rays, thus sealing is completed. A terminal portion 12 is connected to a wiring which extends to the inside and the outside of the sealing region. The organic EL display device is formed by connecting an outside wiring to the terminal portion 12.

Figure 3:
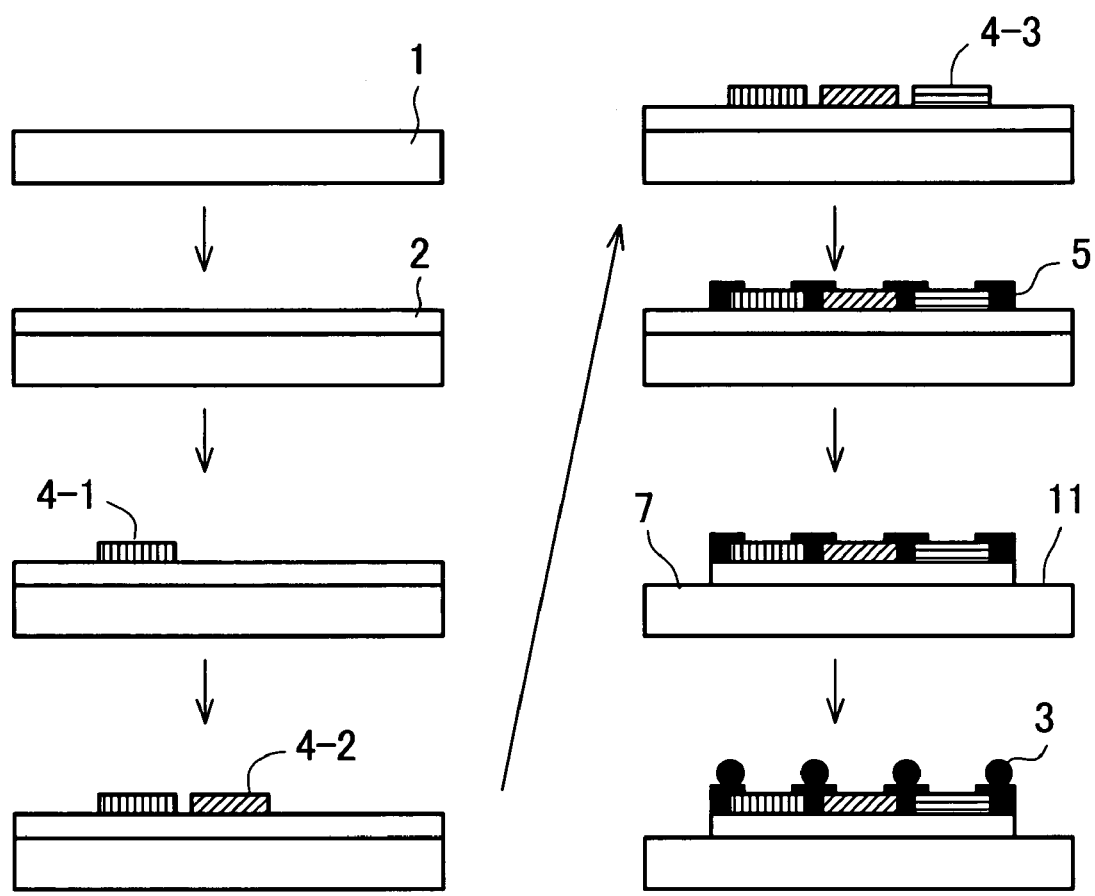
FIG. 3 is a manufacturing flow chart of a sealing substrate.

FIG. 3 shows a manufacturing process of the sealing substrate.

By taking succeeding steps into consideration, for the transparent desiccant layer 2, a physical-absorption type is used. The transparent desiccant 2 functions as a desiccant from which absorbed water is removed by heating before being sealed. To be specific, a chemical compound solution which includes colloidal silica is coated to a glass, is dried and is baked so as to form the chemical compound solution into a gel form, and a film is formed by coating the chemical compound solution. In this manner, it is possible to obtain the physical-absorption type desiccant which can absorb or desorb water in a reversible manner.

Photosensitive resin solutions into which pigments of respective colors of red, blue and green which form the color filter 4 later are individually applied to the transparent desiccant layer 2 and, thereafter, exposed, developed and baked sequentially to form red filters 4-1, green filters 4-2 and blue filters 4-3.

Next, chromium oxide, metal chromium are formed by a sputtering method in this order and, thereafter, resist coating, drying, developing by exposure, etching and peeling are performed so as to form the black matrix 5 having conductivity.

When the sealing seal region shown in FIG. 2 has a film thickness of 5mm or more, the moisture intrudes along a desiccant and hence, it is preferable to remove the desiccant in the sealing portion by etching. In this embodiment, by adopting the color filters 4 and the black matrix 5 as protective layers, the transparent desiccant 2 in the sealing seal region is removed by etching using a fluoric acid. When the etching is performed for a long time, an outermost peripheral end portion of the black matrix 5 and an outermost peripheral end portion of the transparent desiccant have substantially the equal shape. However, by taking the function of the desiccant into consideration, the transparent desiccant 2 is formed to project to a space between the outside of the outermost periphery of the black matrix 5 and the arrangement region of the sealing agent.

Next, the conductive beads 3 are scattered on the black matrix 5 using a dispenser. The conductive beads 3 function as spacers between the TFT substrate 9 and the sealing substrate 1 and, at the same time, since the black matrix 5 is conductive, the black matrix also functions as a bypass line via the conductive beads 3. Accordingly, the black matrix 5 functions as an auxiliary line of the upper electrode 6 thus giving rise to an advantageous effect to suppress the lowering of a voltage attributed to high sheet resistance of the upper electrode 6.

Figure 4:
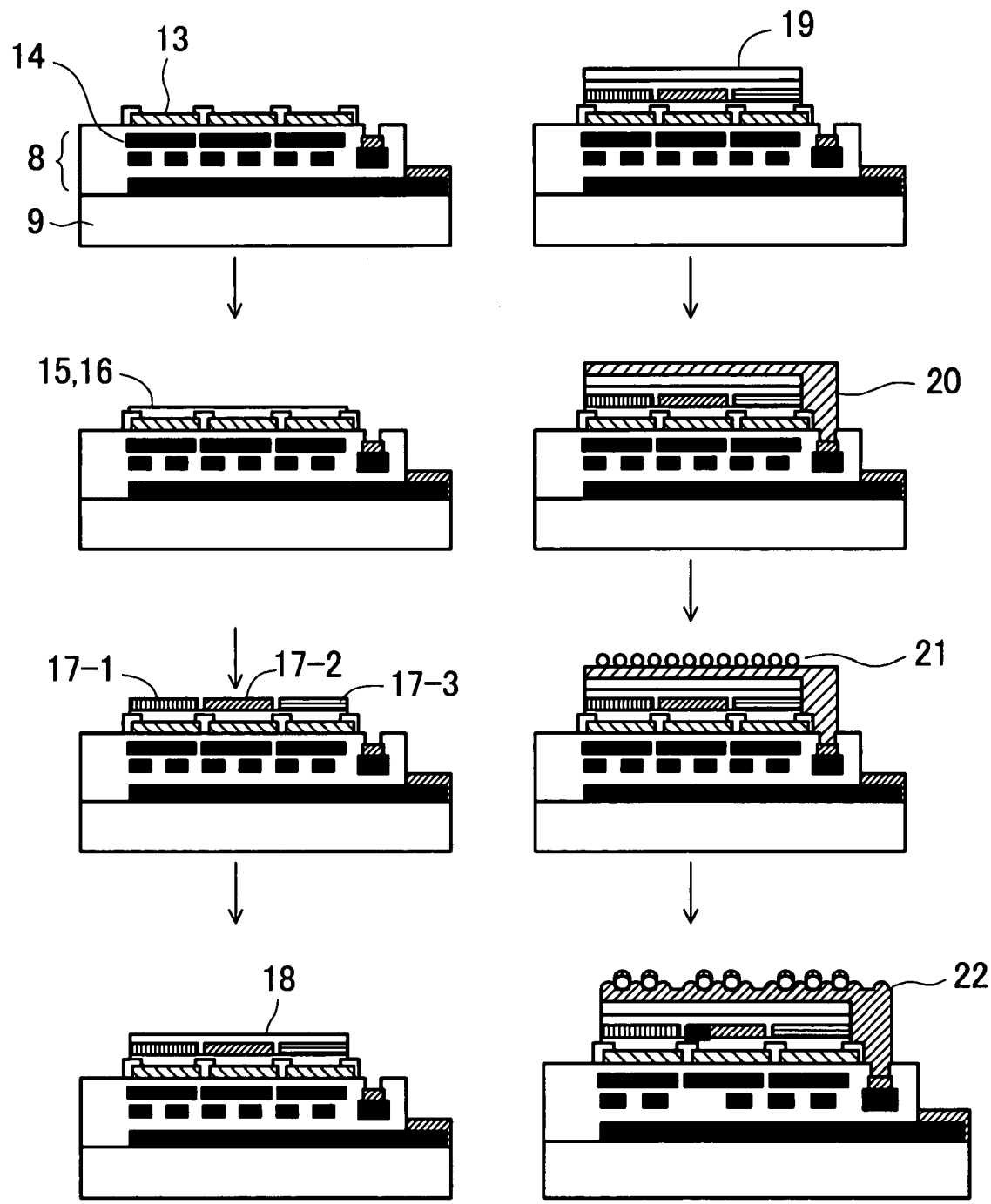
FIG. 4 is a flow chart for forming organic EL elements on a TFT substrate.

Next, a step for forming the organic EL elements 7 on the TFT substrate 9 is explained in conjunction with FIG. 4.

First of all, TFTs are formed on the TFT substrate 9 which is formed of a glass substrate. A TFT forming layer is roughly constituted of two regions. One region includes pixel circuits which control light emitting intensities of the organic EL elements 7 of respective pixels for respective pixels and peripheral circuits which perform controls of the pixel circuits.

The pixel circuit is connected to a lower electrode of the organic EL element 7. The lower electrode is formed for every pixel. Further, the lower electrode is formed of two layers. A lower layer of the lower electrode is formed of a metal lower electrode 14 which is made of alloy which mainly contains aluminum having high reflective property. An upper layer of the lower electrode is constituted of a transparent lower electrode 13 made of oxide of indium and tin (ITO) which functions as a protective oxide prevention layer of the alloy layer made of alloy which mainly contains aluminum. Here, when the organic EL element is readily formed after forming the TFT, the transparent lower electrode 13 may not be formed after forming alloy which mainly contains silver besides aluminum having high reflectance as the metal lower electrode 14.

The organic EL element 7 forms, on this transparent lower electrode 13, layers respectively formed by vapor deposition constituting of a co-vapor-deposit film made of Li/trihydroxyquinoline aluminum at a rate of 1:1 and having a film thickness of 10 nm which constitutes an electron injection layer 15, a vapor-deposit film made of trihydroxyquinoline aluminum and having a film thickness of 10 nm which constitutes an electron transport layer 16, a light emitting layer 17 having a thickness of 40 nm, a tri-annealing amine type hole transport layer 18 having a thickness of 10 nm, a vanadium pentaoxyde layer having a thickness of 10 nm which constitutes a hole injection layer 19, and further includes a ZnO (zinc oxide) thereon which constitutes a first upper electrode 20 formed by sputtering method. Here, the light emitting layer 17 is coated separately to form a red light emitting layer 17-1, a green light emitting layer 17-2, and a blue light emitting layer 17-3. As mentioned above, a surface of the upper electrode 6 which constitutes the uppermost layer of the organic EL element 7 has a structure which scatters light.

The upper electrode 6 is formed such that the first upper electrode 20 is formed and, thereafter, fine particles 21 are sprinkled on the first upper electrode 20, and over which a second upper electrode 22 is formed. The first upper electrode 20 is constituted of an IZO having a thickness of 30 to 100 nm which is formed by sputtering method as mentioned above. It is preferable that the fine particles 21 have a size which is equal to or less than several pm or preferably equal to or less than 1 µm and equal to or more than 50 nm, wherein although materials such as silica, alumina powder, talc, plastic powder can be used, silica beads are preferable. Here, the above-mentioned first upper electrode 20 is formed over the whole surface of the display region.

Further, the second upper electrode 22 is formed by sputtering and hence, when the fine particles 21 are arranged to form an umbrella, the second upper electrode 22 is hardly formed below the umbrella. Accordingly, to ensure the formation of the fine particles also in a gap which becomes a shade, here used are the fine particles 21 which can form a little umbrella even when such an umbrella is formed. As a result, there is provided the structure which embeds some fine particles 21 in the second upper electrode 22. When the height of the second upper electrode 22 is set smaller than the height of the fine particles 21, the second upper electrode 22 covers upper surfaces of the fine particles 21 and the fine particles covered 21 are exposed from the second upper electrode 22 which is present under the fine particles 21. Still further, when the fine particles 21 are removed, traces of the fine particles 21 form holes which are recessed in a raised curved surface like a crater of a volcano.

Further, when a height of the second upper electrode 22 is set larger than a height of the fine particles 21, although there is provided the structure which embeds all fine particles 21 in the second upper electrode 22, peripheries of the fine particles 21 form raised circular surfaces. Here, a plurality of fine particles 21 is provided for every one pixel. In this manner, by arranging the fine particles 21 on the upper electrode 6 or in the inside of the upper electrode 6, it is possible to impart the light scattering property to the upper electrode 6 thus enhancing the light acquisition efficiency.

Figure 5:
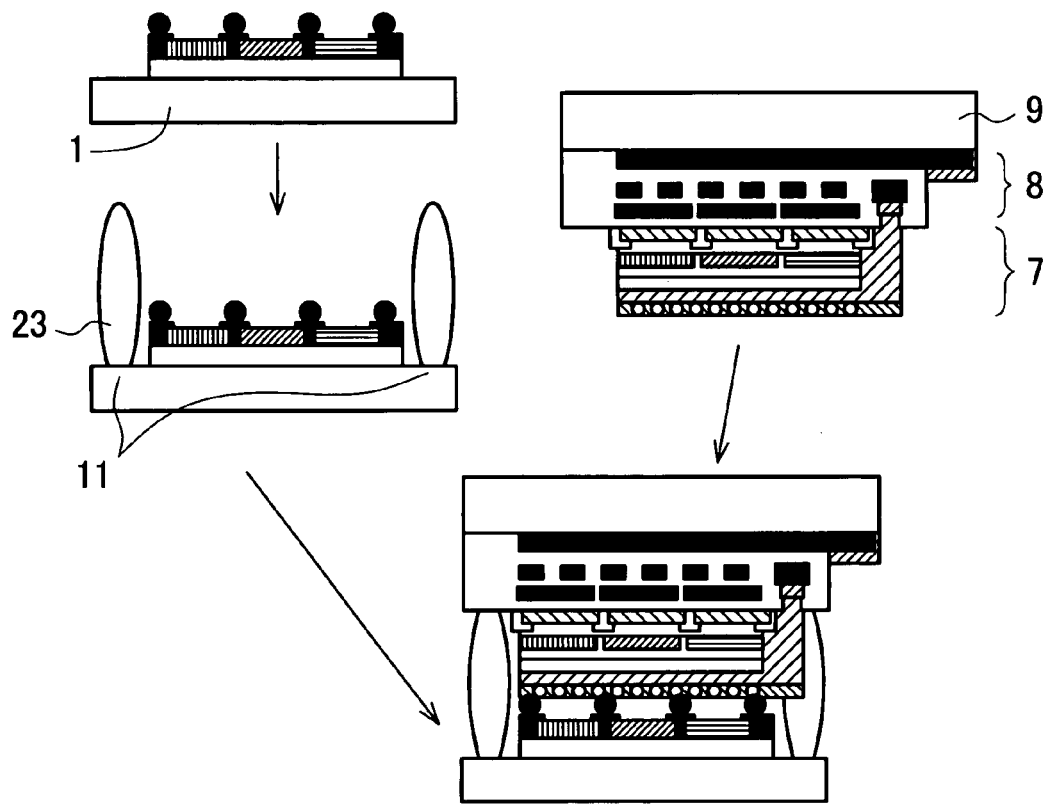
FIG. 5 is a view showing a sealing step.

Next, steps for adhering sealing substrate 1 shown in FIG. 4 and the TFT substrate 9 shown in FIG. 3 which are formed as described above is explained. FIG. 5 shows a sealing step.

Before adhering these substrates 1, 9, for dehydrating the desiccant which is formed on the sealing substrate 1, the inside of the chamber is deaerated and, thereafter, a nitrogen gas is sealed in the chamber. Then, the substrates 1 and the desiccant are heated at a temperature of 150 to 200° C. for 10 to 20 minutes thus generating the dry atmosphere of inert gas.

A sealing agent 23 is applied to a sealing agent applicable area 11 of the sealing substrate 1 in the inert dry atmosphere, and the TFT substrate 9 is aligned with and adhered to the sealing substrate 1 and, thereafter, the sealing agent 23 is cured by ultra violet rays thus sealing a space defined between the sealing substrate 1 and the TFT substrate 9.

As described above, a gas layer is maintained in a space which is supported on the conductive beads 3, and the dry nitrogen is sealed in the gas layer. Due to the gas layer, light emitted from the upper electrode 6 enters the space having a refractive index of approximately 1 and, thereafter, the light is again radiated into air having a theoretical refractive index of 1 via the color filter 4, the transparent desiccant 2 and the sealing substrate 1. The members which are interposed in the midst of such radiation of the light have the refractive indexes larger than the refractive index of the gas and hence, the light which is incident on the above-mentioned members from the gas layer of the sealing space having the refractive index of approximately 1 passes through the respective interfaces with angles equal to or more than a critical angle and hence, the light does not assume a waveguide mode. When the light is directly incident on the glass without forming the space between the upper electrode 6 and the sealing substrate 1, the light assumes a mode in which the light propagates in the inside of the glass and hence, the light acquisition efficiency is largely lowered.

Embodiment 2

Figure 6:
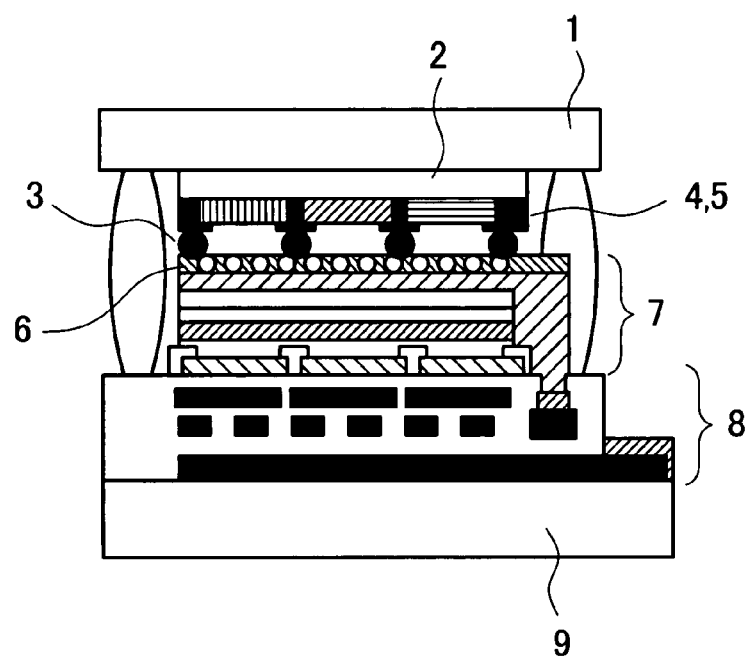
FIG. 6 is a schematic cross-sectional view of an organic EL display device.

FIG. 6 is a schematic cross-sectional view of an organic EL display device.

A point which makes the embodiment 2 differ from the embodiment 1 lies in that since it is difficult to finely perform coating and vapor-depositing light emitting layers in division, the light emitting layer of the embodiment 2 is formed of a monochromatic light emitting layer. This monochroic light emitting layer is a white light emitting layer and is realized by stacking red, green and blue light emitting layers on the electron transport layer in this order and, thereafter, by forming a hole transport layer, a hole injection layer and an upper electrode.

Coloring may be also performed in the same manner also by using a color conversion layer which uses a phosphor material in place of color filters 4. In this case, the light emitting layer is formed of a blue light emitting layer which contains ultraviolet rays. In this case, light is once converted into energy in the color conversion layer and, thereafter, the energy is converted into light again and hence, it is possible to form the inside of the color conversion layer or the sealing substrate into a light guide mode whereby the light acquisition rate is lowered.

Embodiment 3

Figure 7:
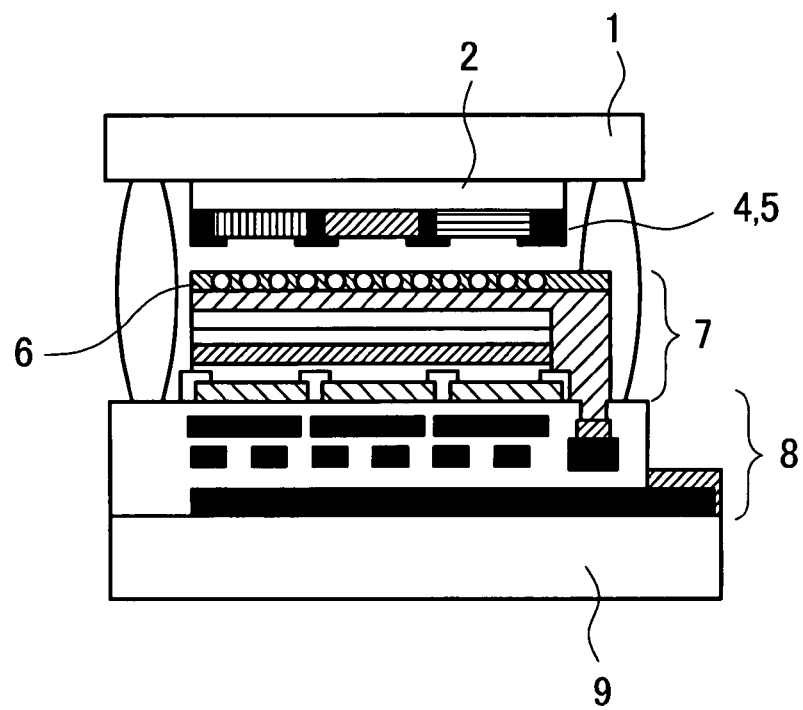
FIG. 7 is a schematic cross-sectional view of an organic EL display device.

FIG. 7 is a schematic cross-sectional view of an organic EL display device.

A point which makes this embodiment differ from the embodiment 1 lies in that the conductive beads 3 are omitted. It is unnecessary to make a black matrix 5 function as an auxiliary line and hence, the black matrix 5 may not be always conductive. With respect to a small-sized black matrix 5 having a short side of a profile set to 50 nm or less, an electric current which flows in a lower electrode of each pixel is small and brightness inclination attributed to the resistance of an upper electrode 6 which constitutes a common electrode does not occur frequently and hence, the auxiliary line is not always necessary. Further, even when the conductive beads are not provided, it is possible to maintain a gas layer which defines a gap between a sealing substrate 1 and a TFT substrate 9.

Embodiment 4

Figure 8:
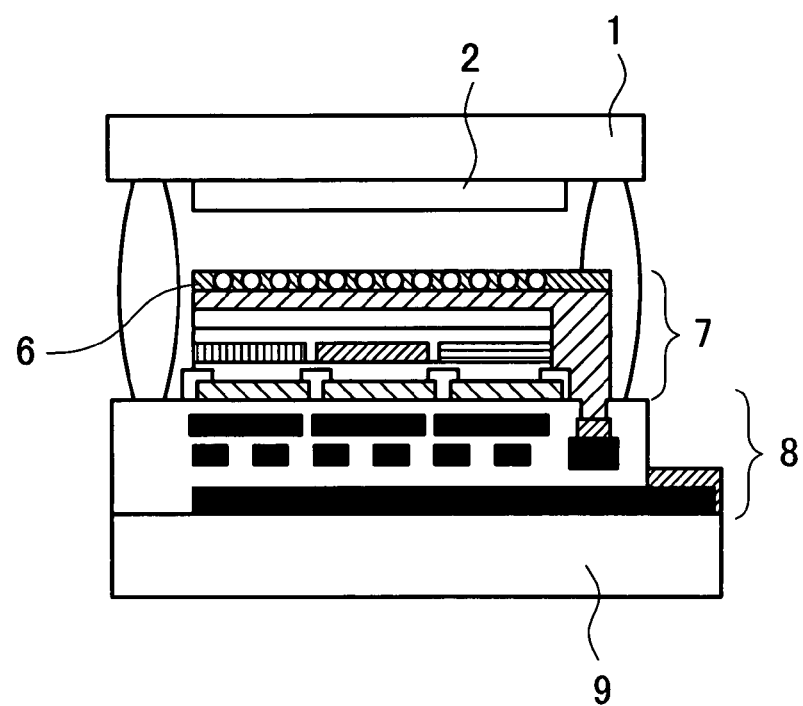
FIG. 8 is a schematic cross-sectional view of an organic EL display device.

FIG. 8 is a schematic cross-sectional view of an organic EL display device.

A point which makes this embodiment differ from the embodiment 3 lies in that the color filters are omitted. The brightness can be increased by an amount corresponding to the omission of the color filters thus realizing a bright organic EL display device.

Embodiment 5

Figure 9:
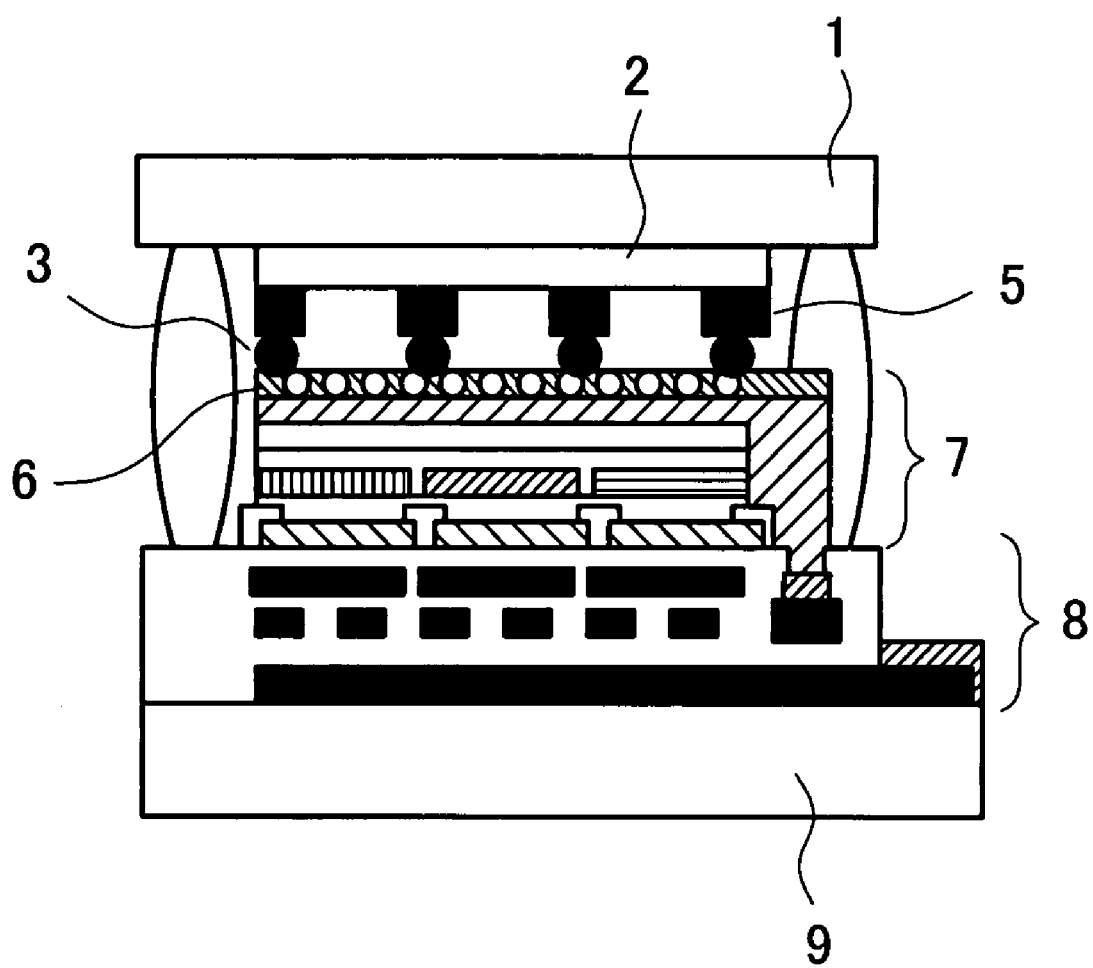
FIG. 9 is a schematic cross-sectional view of an organic EL display device.

FIG. 9 is a schematic cross-sectional view of an organic EL display device.

A point which makes this embodiment differ from the embodiment 1 lies in that the color filters are omitted. Although there is completely no difference between this embodiment and the embodiment 1 with respect to the function of the auxiliary line due to the black matrix 5 and the conductive beads 3, the brightness can be increased by an amount corresponding to the omission of the color filters thus realizing a bright organic EL display device.

What is claimed is:

1. An organic EL display device of top emission type which includes organic EL elements each of which is formed by stacking a reflective lower electrode, a function layer and a light-transmissive upper electrode in order, wherein the upper electrode contains a plurality of fine particles which are made of a material different from a material of the upper electrode.

2. An organic EL display device according to claim 1, wherein the fine particles are made of silica.

3. An organic EL display device according to claim 1, wherein a portion of the upper electrode is provided below the fine particles, and a portion of the upper electrode is also provided above the fine particles.

4. An organic EL display device according to claim 1, wherein a sealing substrate which seals the organic EL elements by way of a space is provided outside the upper electrodes of the organic EL elements.

5. An organic EL display device according to claim 2, wherein a sealing substrate which seals the organic EL elements by way of a space is provided outside the upper electrodes of the organic EL elements.

6. A manufacturing method of an organic EL display device of top emission type which includes organic EL elements each of which is formed by stacking reflective lower electrodes, a function layer and light-transmissive upper electrodes in order, wherein fine particles which are made of a material different from a material of the upper electrode are formed after forming a portion of the upper electrodes and, thereafter, remaining upper electrodes are formed.

* * * * *